(12) United States Patent
Byrd (10) Patent No.: US 6,819,132 B2
(45) Date of Patent: Nov. 16, 2004

(54) METHOD TO PREVENT DAMAGE TO PROBE CARD

(75) Inventor: Phillip E. Byrd, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/327,468

(22) Filed: Dec. 20, 2002

(65) Prior Publication Data

US 2003/0122570 A1 Jul. 3, 2003

Related U.S. Application Data

(62) Division of application No. 09/888,689, filed on Jun. 25, 2001.

(51) Int. Cl.[7] ............................................... G01R 31/26
(52) U.S. Cl. ........................................................ 324/765
(58) Field of Search ................................ 324/765, 763, 324/760, 758, 754

(56) References Cited

U.S. PATENT DOCUMENTS

| | | | |
|---|---|---|---|
| 3,581,160 A | | 5/1971 | Piccone et al. |
| 4,089,734 A | | 5/1978 | Bierig |
| 4,198,744 A | | 4/1980 | Nicolay |
| 4,682,204 A | | 7/1987 | Shiozaki et al. |
| 4,757,256 A | * | 7/1988 | Whann et al. ............... 324/758 |
| 4,882,466 A | * | 11/1989 | Friel ........................... 219/219 |
| 4,906,920 A | * | 3/1990 | Huff et al. ................... 324/754 |
| 5,177,439 A | | 1/1993 | Liu et al. |
| 5,323,107 A | * | 6/1994 | D'Souza ...................... 324/754 |
| 5,461,327 A | * | 10/1995 | Shibata et al. ............... 324/760 |
| 5,532,613 A | * | 7/1996 | Nagasawa et al. ........... 324/761 |
| 5,565,767 A | * | 10/1996 | Yoshimizu et al. ....... 324/158.1 |
| 5,608,257 A | | 3/1997 | Lee et al. |
| 5,832,595 A | | 11/1998 | Maruyama et al. |
| 5,838,163 A | | 11/1998 | Rostoker et al. |
| 5,898,700 A | | 4/1999 | Kim |
| 6,005,401 A | | 12/1999 | Nakata et al. |
| 6,037,785 A | | 3/2000 | Higgins |
| 6,068,892 A | * | 5/2000 | Ma ............................. 324/765 |
| 6,072,679 A | * | 6/2000 | Myong ........................ 361/106 |
| 6,127,837 A | * | 10/2000 | Yamamoto et al. .......... 324/765 |
| 6,181,144 B1 | | 1/2001 | Hembree et al. |
| 6,181,145 B1 | * | 1/2001 | Tomita et al. ............... 324/754 |
| 6,229,329 B1 | * | 5/2001 | Nakata et al. ............... 324/765 |
| 6,370,766 B1 | | 4/2002 | Degani et al. |
| 6,433,563 B1 | * | 8/2002 | Maruyama ................... 324/754 |
| 2002/0080545 A1 | * | 6/2002 | Slater et al. ................. 361/106 |
| 2003/0096157 A1 | * | 5/2003 | Welsh .......................... 429/62 |

FOREIGN PATENT DOCUMENTS

| | | | | | |
|---|---|---|---|---|---|
| JP | 06067241 A | * | 3/1994 | ............. | G02F/3/00 |
| JP | 2002124552 A | * | 4/2002 | ........... | H01L/21/66 |

OTHER PUBLICATIONS

Patent Abstracts of Japan, Application No. 61174771 to Nakatsu Kazuhiko, dated Jul. 24, 1986.
Patent Abstracts of Japan, Application No. 01158367 to Sasaki Mamoru et al., dated Jun. 22, 1989.
Patent Abstracts of Japan, Application No. 09090581 to Meguro Taro, dated Apr. 9, 1997.

* cited by examiner

*Primary Examiner*—Kamand Cuneo
*Assistant Examiner*—Jermele Hollington
(74) *Attorney, Agent, or Firm*—TraskBritt (57) ABSTRACT

Probe cards are configured with protective circuitry suitable for use in electrical testing of semiconductor dice without damage to the probe cards. Protective fuses are provided in electrical communication with conductive traces and probe elements (e.g., probe needles) of a probe card. The fuses may be active or passive fuses and are preferably self-resetting, repairable, and/or replaceable. Typically, the fuses will be interposed in, or located adjacent to, conductive traces residing over a surface of the probe card. Methods of fabricating a probe card are provided, as well as various probe card configurations. A semiconductor die testing system using the probe card is also provided.

8 Claims, 9 Drawing Sheets

METHOD TO PREVENT DAMAGE TO PROBE CARD

CROSS-REFERENCE TO RELATED APPLICATION

This application is a divisional of application Ser. No. 09/888,689 filed Jun. 25, 2001, pending.

BACKGROUND OF THE INVENTION

1. Field of the Invention

The present invention relates generally to probe cards for testing the electric characteristics of semiconductor dice. More specifically, the present invention relates to probe cards configured with protective circuitry suitable for use in electrical testing of semiconductor dice without damage to the probe cards.

2. Background of the Invention

In the manufacture of semiconductor devices, a large number of semiconductor devices, also known as dice or integrated circuit chips (ICs or chips), are formed on a semiconductor wafer by using, for example, precision photolithographic technologies. These fabricated semiconductor devices are subjected to a series of test procedures in order to assess the electrical characteristics of the integrated circuits contained on the semiconductor devices. Semiconductor devices which have been found to be satisfactory by testing procedures are selectively transferred for subsequent processing such as die attach, wire bonding, and encapsulation. New integrated circuit designs and higher unit volumes are additional considerations that drive testing of ICs. Also, as IC devices become more complex, the need for high-speed and accurate testing becomes increasingly important.

IC device testing procedures conventionally include "wafer-level probe testing" in which individual ICs or groups of ICs, while still on the wafer, are initially tested to determine functionality and/or speed. Wafer probing establishes a temporary electrical contact between the IC and the automatic test equipment and is a critical step for verifying design and performance of the IC and for sorting ICs before singulation and costly packaging. Other tests, such as speed testing and "burn-in" testing, are typically performed after the dice have been singulated from the wafer. IC testing further typically involves testing for various performance parameters while changing environmental conditions such as temperature, voltage and current.

Typically, testing at the wafer level involves the use of probe cards and other test heads to electrically test ICs by making electrical connection interfaces with groups of ICs or a single IC at a time. If the wafer has a yield of ICs which indicates that the quality and quantity of functional ICs is likely to be good, the individual ICs are singulated or "diced" from the wafer with a wafer saw. Each individual die may be assembled in a package to form an IC device, or may be bumped with solder (usually prior to separation from the wafer) for direct flip-chip bonding to a semiconductor substrate. Other various packaging means may also be used, as is known to those of skill in the art.

The test signals can include specific combinations of voltages and/or currents transmitted through the probe card to the ICs on the wafer. During the test procedure, response signals such as voltage, current and frequency are analyzed and compared to required values by a test controller. Thus, by applying the appropriate voltages and/or currents and monitoring the device response, a computer program running the testing apparatus determines the functionality of the die. The integrated circuits that do not meet specification can be marked or mapped in software. Following testing, defective circuits in the ICs may be repaired by actuating fuses (or anti-fuses) to inactivate the defective circuitry and substitute redundant circuitry.

Conventional probe cards can be generally classified into two categories: needle-type probe cards and membrane-type probe cards. Needle-type probe cards are the most common type of probe card and include elongated probe needles mounted on an annular ring. A typical probe needle is a pointed needle-like element of small size, with a tip that tapers down into a sharp point. When mounted on the annular ring, the probe needles typically have their free ends pointing downward and are carefully aligned with the ends of all the other probe needles to be in a single plane. An exemplary probe needle configuration is disclosed in U.S. Pat. No. 5,532,613 to Nagasawa et al., which includes a probe needle having a pointed or conical tip. Probe needles are typically made of tungsten, but materials such as beryllium copper, palladium, and rhenium tungsten are also used.

The probe needles are typically secured to the annular ring by epoxy or are bonded, as by welding, to a blade and are adapted to make temporary electrical connections between contact locations on the dice (e.g., bond pads, fuse pads, test pads) and external test circuitry. The annular ring, in turn, is attached to a printed circuit board (PCB) substrate. The PCB substrate typically includes electrical traces in electrical communication with the probe needles. An exemplary probe card having probe needles is described in U.S. Pat. No. 4,757,256 to Whann et al.

Membrane-type probe cards are typically formed as having tungsten contact bumps disposed on a thin, flexible dielectric material, such as polyimide, as the membrane. Membrane-type probe cards commonly employ a multilayer, flexible PCB interconnection structure configured with fine pitch traces leading to low inductance bump array structures aligned with the location of the pads of the device under test (e.g., a semiconductor die being tested). In a conventional membrane probing system, contact bumps of the bump array structures are pressed down via an elastic body interposed between the contact bumps and the membrane, such that any height variation among the contact bumps can be absorbed by the flexible thickness of the elastic body. Exemplary membrane-type probe cards are disclosed in U.S. Pat. No. 4,906,920 to Huff et al. and in U.S. Pat. No. 6,181,145 to Tomita et al.

Needle-type probe cards and membrane-type probe cards may be further configured to meet the needs of the particular devices under test. In this regard, the probe cards may be specially configured as vertical contact probe cards (used, for example, to test LOGIC devices of a C4 type), cantilever-type probe cards (generally used to test innerleads of LCD drivers with super fine-pitch (e.g., 40 micron-pitch) bumps), probe cards for wafer level burn-in, probe cards configured to test high-speed microprocessor units (MPUs) with high pin counts, as well as various other types of probe cards known in the art.

In all types of probe cards, the testing voltage current is carried from an external test circuit to the pad connecting sections (probe elements) of the probe cards through conductive traces or wiring in electrical communication therewith.

One concern in the art is over the application of excessive voltage to the IC chip under test. In this regard, U.S. Pat. No. 6,127,837 to Yamamoto et al. ("Yamamoto") describes a series of resistance, transistor and capacitance structures formed on a probe wafer between a test bump and a shared power/signal line. According to Yamamoto, the resistance, transistor and capacitance structures prevent overshoot or undershoot of signals supplied to the bump and also prevent the application of excessive voltage or current to the chip. Yamamoto, however, does not disclose methods or apparatus for protection of the probe wafer and further does not describe a probe card configured to carry the current-regulating structures.

The delivery of excessive voltage during probe testing to an IC may also result in damage to the probe card. In Japanese Patent Application 61174771, a small fuse is provided on the backside surface of a probe card in order to prevent the end of a probe needle connected to a grounding pad from seizing due to an overcurrent delivered to a short-circuited IC. Japanese Patent Application 0115367 discloses a thermal fuse fixed between a probe needle and power source which generates heat and becomes fused before a probe pin generates heat and is fused. Each of these patent applications, however, is drawn to means for preventing seizing and fusing of a probe needle routed to ground and power and does not address the limitation of current through the probe card in general or through any probe needle which might otherwise cause that probe needle to become nonfunctional.

Japanese Patent Application 04265541 discloses an array of easily exchanged fuses interposed between corresponding probes on a probe card and a power supply. The apparatus disclosed therein, however, is relatively bulky in that the fuses are vertically disposed over the probe card and the apparatus includes a fuse body for holding the fuses.

Accordingly, what is needed in the art is a probe card configuration designed to limit current to a plurality of varying probe elements, not just ground and power. It would also be advantageous to provide a probe card with one or more fuses that are self-resetting, or readily replaceable and/or repairable. Fuses which can be fabricated simultaneously with other components on the probe card using processes which are well known in the semiconductor arts are also desirable. A probe card thus manufactured would extend the life of the probe card, therefore, saving time, materials, and costs for those involved in semiconductor dice testing operations.

BRIEF SUMMARY OF THE INVENTION

In accordance with one aspect of the invention, a method of forming a probe card is provided. The method comprises providing a substrate having a first surface and a second surface; disposing a plurality of conductive traces adjacent at least one of the first surface and the second surface; providing a plurality of probe elements in electrical communication with the plurality of conductive traces; and providing a plurality of fuse elements in respective electrical communication with at least some of the plurality of conductive traces, at least some of the plurality of fuse elements disposed immediately adjacent at least one of the first surface and the second surface. Additionally, the fuse elements may be passive or active fuse elements, and the fuse elements may further be configured to be self-resetting, repairable and/or replaceable. In a preferred embodiment, substantially all of the conductive traces are provided with a respective fuse element.

A method of fabricating a probe card is also provided. The method comprises providing a probe card substrate; providing a plurality of conductive traces over a surface of the probe card substrate; providing a plurality of probe elements in electrical communication with the plurality of conductive traces wherein at least one of the probe elements is configured for supplying a test signal to at least one semiconductor die and wherein a second probe element is configured for receiving a test signal from the at least one semiconductor die; and providing at least one repairable or replaceable component in electrical communication with at least some of the plurality of conductive traces.

In a still further embodiment, a method of using a probe card for testing at least one semiconductor die is disclosed. The method comprises providing a probe card having a plurality of probe elements connected thereto, the probe elements configured for supplying test signals to the at least one semiconductor die; providing a fuse in electrical communication with at least some of the probe elements; and testing the at least one semiconductor die by supplying test signals.

In accordance with another aspect of the invention, a probe card is provided. The probe card includes a substrate having a first surface and a second surface; a plurality of conductive traces disposed adjacent at least one of the first surface and the second surface; a plurality of probe elements in respective electrical communication with the conductive traces; and a plurality of fuses in respective electrical communication with the conductive traces.

In yet another embodiment of the invention, a semiconductor die testing system is disclosed. The semiconductor die testing system comprises a probe card including a substrate having a first surface and a second surface; a plurality of conductive traces disposed adjacent at least one of the first surface and the second surface; a plurality of probe elements in electrical communication with the conductive traces; a plurality of fuses in electrical communication with the conductive traces; and semiconductor device testing apparatus linkable with the probe card, the semiconductor device testing apparatus configured for sending test signals through the probe card.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE ILLUSTRATED EMBODIMENTS

As noted throughout the disclosure, the present invention provides various advantages, including the ability to per-form a multitude of tests, such as functional, parametric, burn-in, high frequency, and other tests, without risk of damage to the probe card. Performing IC testing according to the present invention provides significant cost savings in protecting and allowing reuse of probe cards which might otherwise be damaged by high test temperatures, electrical overloads, and various other sources of electrical failure or operator error during the testing process.

As used herein, use of the term "IC testing" encompasses both "static" testing (where the IC is simply powered up) and "dynamic" testing (where the IC is powered up and is sent signals exercising some degree of functionality over the IC).

Figure 1:
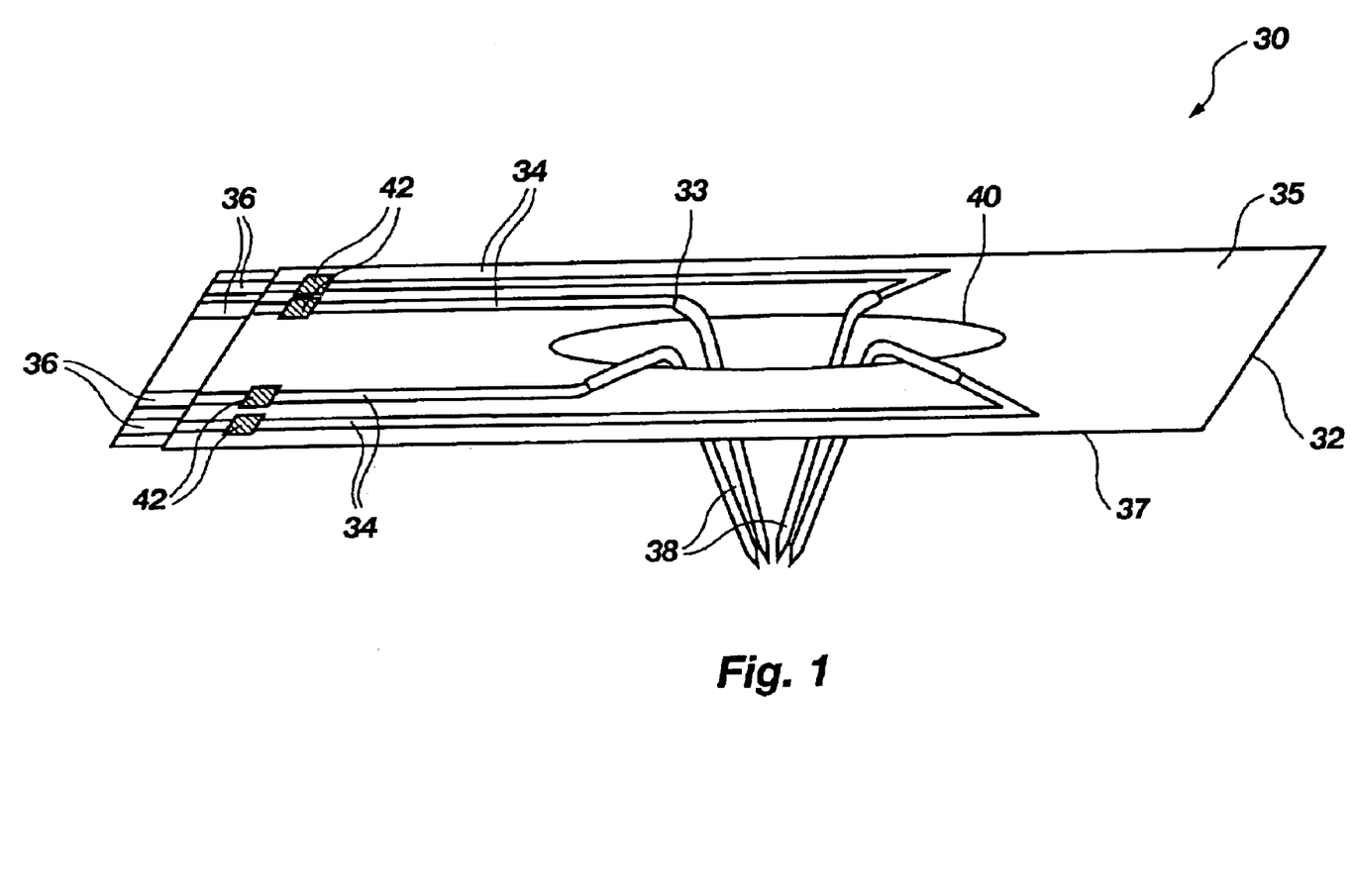
FIG. 1 is a schematic view of a probe card according to an embodiment of the present invention.

Referring to drawing FIG. 1, an exemplary probe card 30 configured in accordance with an embodiment of the present invention is shown in a schematic view. As described in more detail herein, probe card 30 acts as an interface to an IC testing computer which produces appropriate test signals and senses the response of the ICs under test. The probe card 30 includes a substrate 32, typically a PCB substrate, preferably formed of a rigid or semi-rigid material adapted to withstand the stresses associated with IC testing. Materials preferred for use in fabricating substrate 32 include FR-4 and other glass-filled and ceramic resins, silicon (including monocrystalline silicon, silicon-on-glass, silicon-on-sapphire), germanium, gallium arsenide, or other materials that are well-known in the art. In one aspect of the embodiment, substrate 32 may be formed so as to have a coefficient of thermal expansion matching, or closely matching, the ICs to be tested.

Substrate 32 is configured with a plurality of conductive traces 34 formed on or adjacent to one or more surfaces thereof. As can be seen in FIG. 1, the conductive traces 34 extend inwardly from a plurality of test contacts 36 towards a plurality of probe elements 38. When substrate 32 is made of a semiconductor material, an electrically insulating layer, such as silicon dioxide, can be formed on substrate 32 to provide an insulative surface for conductive traces 34 and test contacts 36. The silicon dioxide layer can be formed by methods well-known in the art of silicon-based manufacturing including, for example, chemical vapor deposition (CVD) or exposing a silicon-based substrate to an oxidizing atmosphere for a short time.

In accordance with recognized practices in the semiconductor art, conductive traces 34 may also be formed as a metallization layer under one or more surface layers of substrate 32. Thus, in a second aspect of the embodiment, probe card 30 may be constructed in multilayered fashion, with conductive traces 34 located in intermediate layers of substrate 32. In the currently preferred configuration, the conductive traces 34 are formed on a top surface 35 and/or bottom surface 37 of a probe card 30. Typically, probe card 30 will include one conductive trace 34 in electrical communication with each probe element 38, although more than one conductive trace 34 per probe element 38 is contemplated within the scope of the present invention. In other configurations (not shown), a single conductive trace 34 may provide electrical signals for more than one probe element 38 during testing.

By use of the term "in electrical communication with" it is meant that the subject electrical components are configured and positioned so as to complete an electrical circuit between one another when the components are supplied with power. Thus, components in electrical communication with one another will carry an electrical current originating from the same source when the probe card 30 is operational.

As shown in FIG. 1, test contacts 36 are preferably disposed on a periphery of substrate 32 for electrical interconnection with external testing equipment (not shown). The illustrated arrangement of test contacts 36, however, is not intended to be limiting of the present invention, and test contacts 36 may alternatively be disposed on one or both sides of substrate 32 and/or in a range of various locations, including locations in the area of a centermost portion of substrate 32. Conductive traces 34, which are in electrical communication with test contacts 36, thus provide electrical paths for test circuitry to probe elements 38. Conductive traces 34 are preferably formed of a highly conductive, low resisitivity metal, such as aluminum, copper, titanium, tantalum, molybdenum, or alloys of any thereof. Conductive traces 34 may be fabricated according to conventional methods well known in the art, including, but not limited to, plating, thin film deposition processes (e.g., CVD, sputtering, photolithography processes and etching), and thick film processes (e.g., stenciling or screen printing).

Various other types of conductive traces known in the art are also contemplated for use in the present invention. As a nonlimiting example, conductive traces 34 may include nonmetallic conductive traces which may be formed of materials such as doped polysilicon. In this aspect of the embodiment, an LPCVD process may be used to form a conductive trace 34 of phosphorous-doped polysilicon.

Still referring to FIG. 1, probe elements 38 are illustrated as a plurality of probe needles. The illustration, however, is not intended to be limiting of the present invention, and one of skill in the art will recognize the illustrated probe needles and probe card 30 configuration may be readily substituted for bumps, or other types of electrical contacts known in the art, which are configured for making temporary electrical connections with contact pads of ICs during IC testing.

Probe elements 38 of probe card 30 are arranged in patterns corresponding to patterns of pads on ICs to be tested. For ease of illustration and simplicity in describing the embodiment, only a single pattern of probe elements 38 for testing a single IC is shown. In practice, however, probe card 30 will preferably be configured with a plurality of patterns of probe elements 38, with each pattern forming a corresponding plurality of test sites for testing a plurality of respective ICs. As such, probe elements 38 may be formed in varying arrays and densities corresponding to the pads of the IC devices to be tested. Each probe element 38 interfaces with a surface portion of substrate 32 adjacent a conductive trace 34 at a probe element-substrate interfacing portion 33 of probe card 30.

Probe elements 38 are shown mounted on a ring 40, preferably comprising epoxy, and extending inwardly from a center cutout portion of substrate 32. This illustrated arrangement, however, is not intended to be limiting of the present invention. Thus, probe elements 38 may be configured on probe card 30 in a multitude of conventional or unconventional configurations. Probe elements 38 may be formed of a variety of conductive materials, including, but not limited to, copper and tungsten. As is readily apparent to one of skill in the art, the diameter, taper, and material of the probe elements 38, when formed as probe needles, may be varied to determine the spring rate of the probe.

With further reference to drawing FIG. 1, a fuse 42 is interposed in, or located adjacent to, each conductive trace 34. Preferably, fuses 42 are interposed in, or located adjacent to, conductive traces 34 in regions of probe card 30 which are directly adjacent to one of test contacts 36 and probe elements 38. One of skill in the art will recognize numerous specific locations for fuses 42, including placement immediately adjacent to, and in electrical communication with, terminating ends of conductive traces 34 (e.g., at interfaces with test contacts 36 and probe elements 38).

In a related aspect of the embodiment, fuses 42 are further preferably disposed immediately adjacent at least one of a first surface and a second surface of substrate 32 (e.g., a top surface 35 and a bottom surface 37 of substrate 32). By use of the phrase "disposed immediately adjacent" at least one of a first surface and a second surface of substrate 32, it is meant that a fuse 42 is located such that at least a portion of the fuse 42 is in contact with (either over or under) a surface of substrate 32, or that a fuse 42 is in close proximity to a surface of substrate 32. A fuse 42 that is in "close proximity" to a surface of substrate 32 may, for example, be surrounded by a fuse-holding body (not shown) that is in contact with a surface of substrate 32.

In a preferred embodiment, fuses 42 are interposed adjacently between conductive traces 34 and test contacts 36 and disposed immediately adjacent at least one of a first surface or a second surface of substrate 32 in the case where the conductive traces 34 are carrying signals and/or burn-in voltage into corresponding bond pads of a semiconductor device. In a related aspect of a preferred embodiment, fuses 42 carrying signals or burn-in voltage away from corresponding bond pads of a semiconductor device are disposed immediately adjacent at least one of a first surface or a second surface of substrate 32 and between probe element-substrate interfacing portions 33 of probe card 30 and conductive traces 34.

In a most preferred embodiment of the present invention, fuses 42 are configured to be self-resetting and/or easily repairable or replaceable, such that the probe card 30 may be readily reused for testing at a later time after one or more fuses 42 have been tripped. Preferably, fuses 42 are configured to trip (i.e., provide an "open" in the conductive trace circuitry) at a current level below an absolute maximum current that the probe card 30 or the IC device under test can handle without being damaged. The current-carrying capacity for a fuse 42 may vary depending upon the particular test configuration involving probe card 30. The current-carrying capacity for fuse 42 typically will also vary in accordance with various individual components (e.g., resistors, transistors, capacitors, probe elements 38, etc.) on probe card 30 and/or the particular IC device under test.

Fuses 42 for use in the present invention may be generally classified as active and/or passive fuses. As used herein, a "passive" fuse is a relatively thin conductor which may have its conductive properties disabled upon the application of a predetermined threshold of energy into it. In the context of the invention, the conductive properties of passive fuses may thus be disabled by passing a current of a higher-than-desired threshold through the fuse, thus causing resistive heating within the fuse that results in the fuse conductor melting, cracking, vaporizing, and/or becoming otherwise nonconductive. Preferably, passive fuses for use in the present invention include materials such as titanium tungsten and platinum silicide. Other materials for passive fuses, such as aluminum, copper, nichrome, doped polysilicon, metal silicide or various other conductive metal or alloys, are well known in the art of semiconductor device manufacturing and are also included in the scope of the present invention.

In one aspect of a preferred embodiment of the invention, the passive fuses are formed of the same conductive material(s) as the conductive traces 34 and/or test contacts 36 described herein. Using deposition processes well known in the art, each of fuses 42 may be formed at the same time (simultaneously) as the other fuses 42. In a related aspect of the embodiment, the passive fuses may thus be constructed at the same time as the conductive traces 34 and/or the test contacts 36 using the same deposition and/or other processing steps (e.g., CVD followed by photopatterning). These passive fuses are typically formed and/or repaired by patterning a deposited layer of the conductive material of the fuse over an insulating dielectric layer, typically silicon dioxide, of substrate 32.

In other embodiments of passive fuses, the passive fuses may be prefabricated and placed in electrical communication with testing circuitry on at least one surface of a probe card 30 by mechanical means.

It will be apparent to one of skill in the art that while preferred fuse embodiments are described below, the present invention is not intended to be limited by the described embodiments. In this regard, the present invention incorporates by reference the various embodiments of fuses for use with ICs as disclosed in U.S. Pat. No. 4,198,744 to Nicolay, U.S. Pat. No. 4,682,204 to Shiozaki et al. and U.S. Pat. No. 5,608,257 to Lee et al.

In its simplest form, a passive fuse for use in the present invention may comprise two ends of a conductive trace 34 joined by a "neck" having a width considerably smaller than the width of the conductive trace 34. Referring now to drawing FIG. 2, a preferred configuration of a passive fuse 42a of the present invention is illustrated with passive fuse 42a interposed in a conductive trace 34. A dielectric layer 45 is shown disposed under conductive trace 34 and passive fuse 42a. Passive fuse 42a includes trace interfacing portions 44, 46 in an aspect of the embodiment where the passive fuse 42a is formed of a material differing from that of conductive trace 34. Passive fuse 42a further includes a relatively thin (in comparison to conductive trace 34 and/or trace interfacing portions 44, 46) "neck" or wire portion 48 configured to conduct current up to a predetermined current threshold. Trace interfacing portions 44, 46 are in electrical communication with trace end portions 50, 52 of conductive trace 34, the trace end portions 50, 52 otherwise being "open" in relation to one another (i.e., not in electrical communication with each other).

Figure 2:
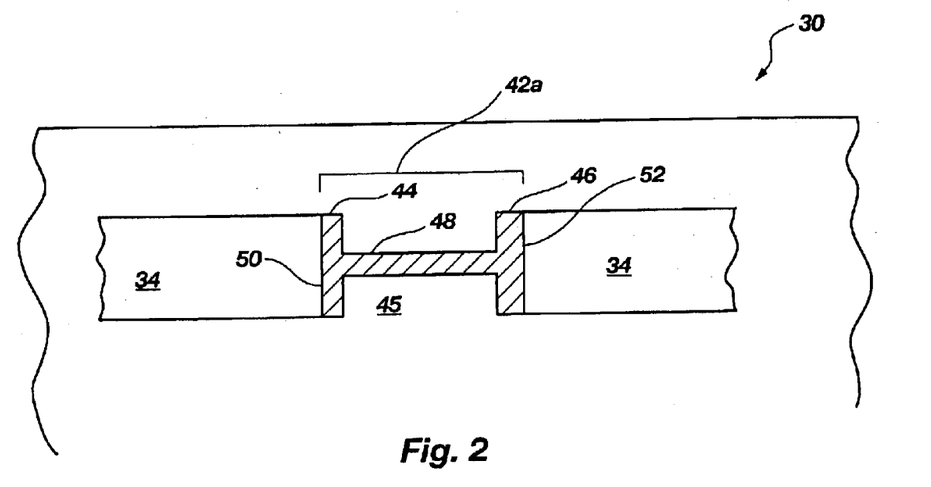
FIGS. 2 and 3 are perspective views of fuse embodiments of the present invention.

In an embodiment where the conductive trace 34 and the passive fuse 42a are formed of the same materials, it should be understood that separate trace interfacing portions 44, 46 of passive fuse 42a need not be formed, and passive fuse 42a may simply comprise a neck portion 48.

Preferably, the predetermined current threshold of passive fuse 42a corresponds to a current level nominally below an absolute maximum current that the probe card 30 or the IC device under test can handle without being damaged. Upon reaching the predetermined current level, passive fuse 42a trips, disabling the circuit to which passive fuse 42a is electrically connected.

Passive fuses 42a may be formed and/or repaired by conventional methods well known in the art, such as conductive layer deposition techniques, photopatterning processes, and etching techniques. As previously discussed, passive fuses 42a may be formed concurrently with the deposition of other conductive structures on probe card 30 (e.g., conductive traces 34, test contacts 36, bond pads for probe elements, etc.), or passive fuses 42a may be deposited or placed on probe card 30 in a separate processing step. The neck portion 48 of a passive fuse 42a may be configured of varying widths dependent upon the nature of the application for which it will be used and the materials used in its construction. In a preferred aspect of the invention, a passive fuse 42a is configured with a neck portion 48 formed of a material selected from the group consisting of titanium tungsten, aluminum, copper, nichrome, doped polysilicon, platinum silicide, and alloys or combinations of any thereof. Further preferably, the neck portion 48 is configured of a width ranging from about 0.3 micron to about 10.0 microns.

Figure 3:
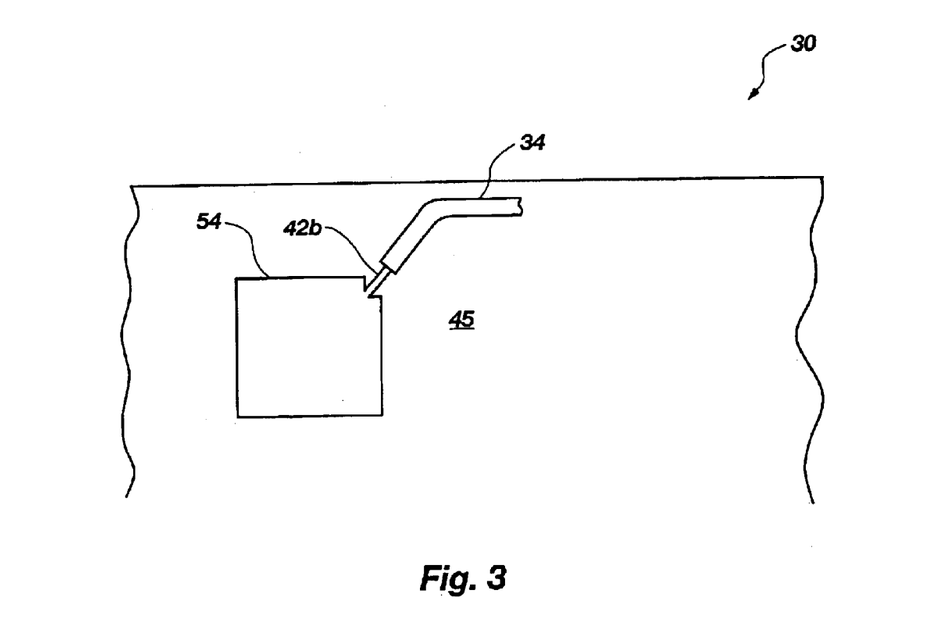

A second preferred passive fuse configuration is shown in drawing FIG. 3. Here, a passive fuse 42b is configured, in part, as a cutout of a bond pad 54, wherein the bond pad 54 may be a test contact 36 or a bonding interface for a conductive trace 34 and a probe element (not shown). In this embodiment, passive fuse 42b forms a conductive fuse-type link between bond pad 54 and a conductive trace 34 and is thus also referred to herein as a "linking fuse" 42b. As can be seen in FIG. 3, linking fuse 42b is relatively narrower in width than conductive trace 34 such that linking fuse 42b will trip in the manner previously described upon the application of an overcurrent into it. Linking fuse 42b may be fabricated using a variety of techniques which typically involve deposition and photopatterning as previously described. A dielectric layer 45 is disposed under trace 34 and passive fuse 42b.

Figure 4A:
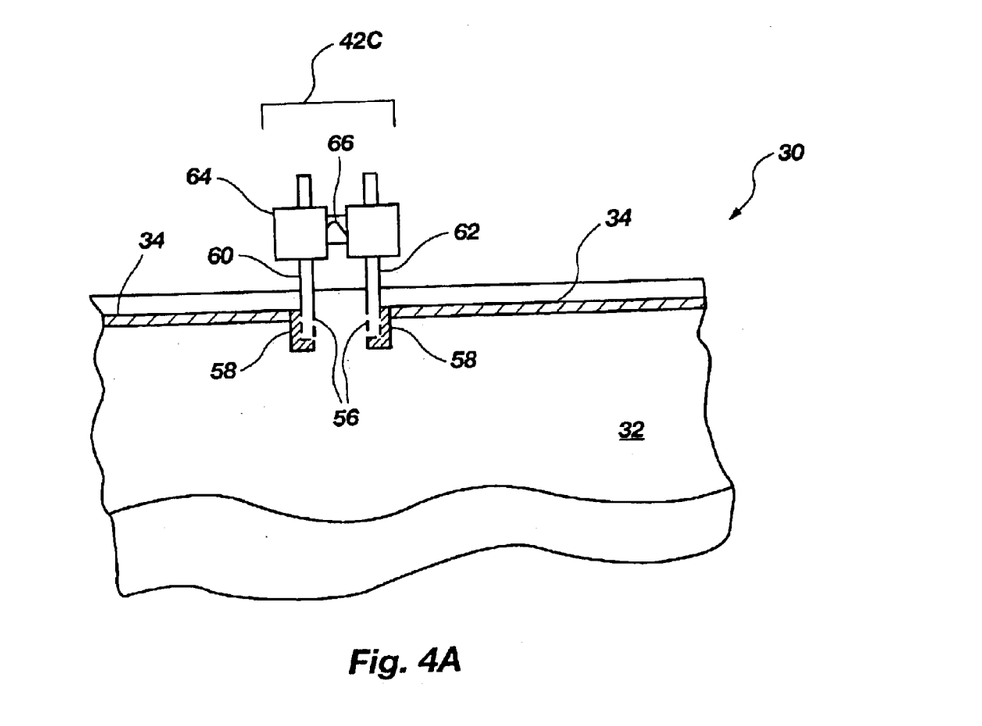
FIGS. 4A and 4B are schematic views of fuse embodiments according to the present invention.

A third preferred embodiment of a passive fuse configuration for use in the present invention is shown in section in drawing FIG. 4A. In this embodiment, a passive fuse 42c is shown as comprising a dual in-line pin header mounted in through-hole portions 56 of substrate 32. Passive fuse 42c is configured with pin portions 60, 62 which are made of conductive material. An insulated and removable connector shell 64 containing a fuse conductor 66 may be positioned on pin portions 60, 62 to carry current up to a predetermined threshold from pin portions 60, 62. In the illustrated embodiment, through-hole portions 56 of substrate 32 are positioned so as to provide an "open" in conductive trace 34. Through-hole portions 56 are configured with inner contacts 58 which are in electrical communication with conductive traces 34. When pin portions 60, 62 of the dual in-line pin header passive fuse 42c are placed in through-hole portions 56 of substrate 32, pin portions 60; 62 are configured to be in electrical communication with inner contacts 58, thus completing a current-carrying circuit through conductive trace 34.

As previously discussed, an overload of current sufficient to damage the probe card 30, components thereof, or an IC device under test will trip the fuse conductor 66, thus disabling the circuit extending through passive fuse 42c. Upon blowing passive fuse 42c, a new connector shell 64 and/or new pin portions 60, 62 can be reinstalled in through-hole portions 56 of substrate 32 to render probe card 30 operational again.

Figure 4B:
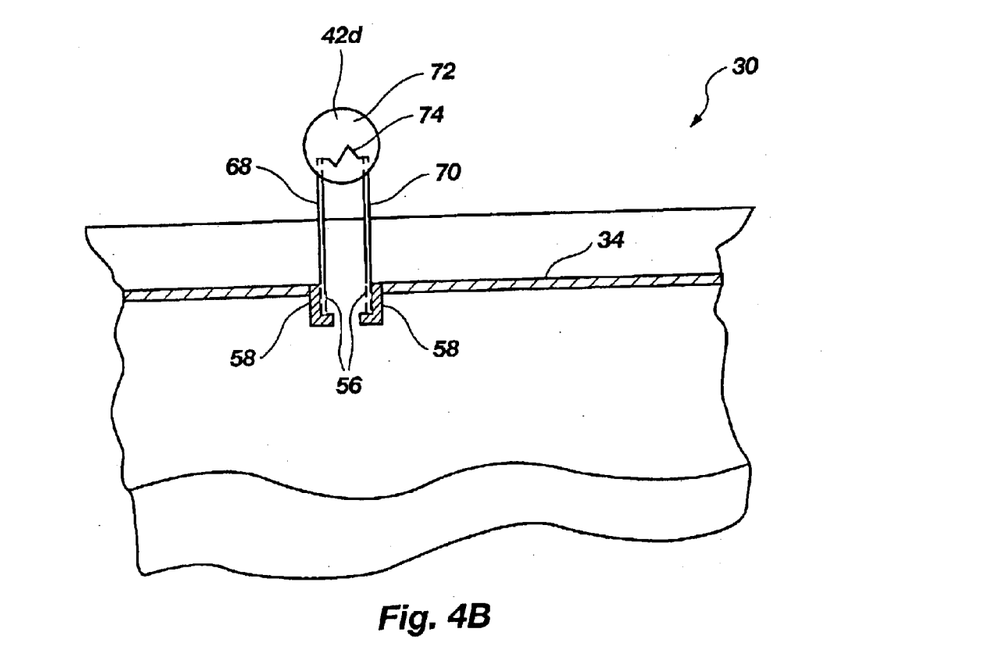

In a related embodiment, a passive fuse 42d configured as a dual-in-line socket is shown in drawing FIG. 4B. Passive fuse 42d comprises pin portions 68, 70 with an insulated connector shell 72 at one end thereof. Pin portions 68, 70 are formed of a conductive material and are in electrical communication with a fuse conductor 74 residing within connector shell 72. Similar to the embodiment shown in FIG. 4A, through-hole portions 56 of substrate 32 are configured with inner contacts 58 and positioned so as to provide an electrical "open" in conductive trace 34. When passive fuse 42d is pressed into through-hole portions 56 and the electrical circuit is completed wherein current can travel from one end portion of a conductive trace 34 to a first inner contact 58, to a first pin portion 60, to fuse conductor 74, to a second pin portion 60, to a second inner contact 58, and through to a second end portion of the conductive trace 34. A current which is sufficiently high to trip passive fuse 42d will thus disable the circuit. To restore the circuit, the blown passive fuse 42d is removed, and a new passive fuse 42d may simply be pressed into through-hole portions 56.

With regard to passive fuses 42c and 42d, one of skill in the art will readily ascertain that the pin portions of these fuses are adaptable for use with conductive traces that are in intermediate layers in substrate 32. In this regard, the pin portions of passive fuses 42c and 42d may, for example, extend downwardly through through-hole portions 56 in substrate 32 to contact conductive pads in electrical communication with a conductive trace in an intermediate layer, thus completing a circuit through the trace.

Furthermore, passive fuses 42c and 42d are but two examples of discrete electrical components that may be used as protective fuses for purposes of the present invention. It will be readily apparent to one skilled in the art that various other conventional designs for discrete electrical components may be readily utilized herein. By use of the term "discrete electrical component" it is meant that the particular electrical component is manufactured separately from the probe card 30 and thus subsequently attached thereto or otherwise integrated therein.

With reference to FIGS. 2, 3, 4A and 4B, each of passive fuses 42a, 42b, 42c and 42d is configured to conduct current under a threshold which will cause damage to probe card 30 and to become disabled when a test current exceeds a threshold under the probe card's maximum current-carrying capacity. Typically, a higher than desired current in a conductive trace 34 (and/or in other components in which a passive fuse 42a, 42b, 42c or 42d is placed) will cause the passive fuse 42a, 42b, 42c or 42d to trip by resistive heating within the fuse, the resistive heating resulting in the fuse conductor (i.e., neck portion 48) melting, cracking, vaporizing or the like. As previously discussed, passive fuses 42a, 42b, 42c and 42d may be replaced or repaired such that probe card 30 may be reused at a later time.

"Active" fuses may also be used to protect probe cards and the components thereon in accordance with the principles of the present invention. "Active fuses," as used herein, are electronic circuits configured to conduct current up to a predetermined level wherein once the predetermined level of current has been exceeded, active fuses are configured to stop conducting current, thus disabling the circuit to which the active fuses are connected. Unlike passive fuses, however, active fuses are configured to automatically reset upon removal of the current overload. Upon self-resetting, the active fuses are again operational to carry current to and from the probe elements on the probe card. Typically, the active fuses for use in the present invention are fast tripping surface mount-type fuses.

Figure 5A:
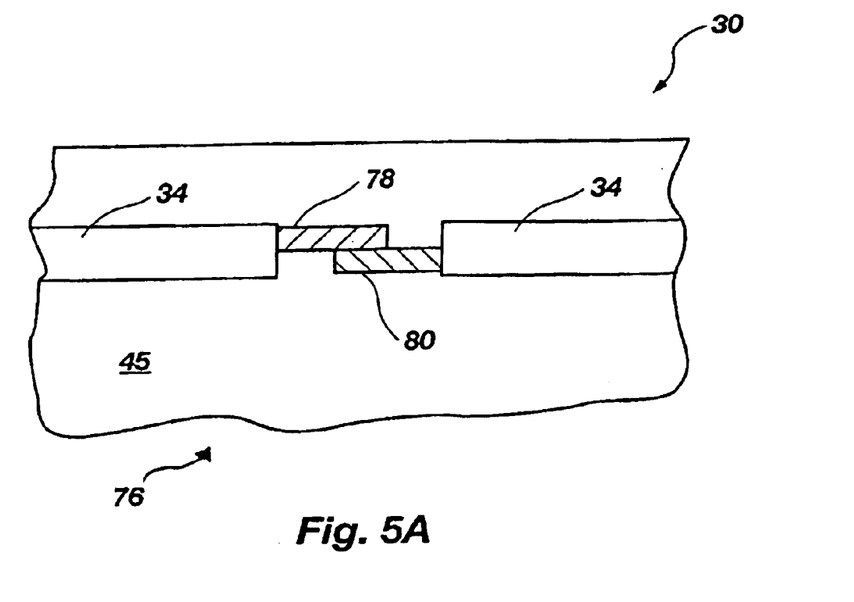
FIGS. 5A and 5B are simplified perspective views of active fuse embodiments of the present invention.
Figure 5B:
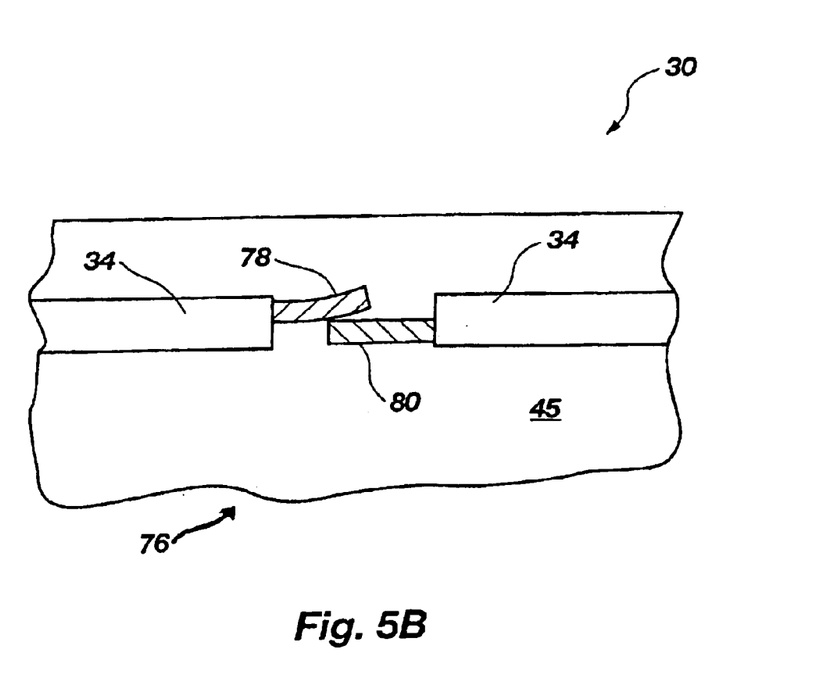

In one aspect of the embodiment, a bimetallic switch may be used as an active fuse according to the present invention. The bimetallic switch as an active fuse may be interposed in, or located adjacent to, a conductive trace 34 in order to limit undesirably high current levels potentially traveling through a probe card 30. A simplified bimetallic switch 76 is shown in FIGS. 5A and 5B in electrical communication with portions of a conductive trace 34 over a dielectric layer 45 of a probe card 30. As is well known in the art, bimetallic switch 76 is formed of a first metal conductor 78 and a second metal conductor 80 having differing rates of thermal expansion.

As shown in FIG. 5A, first metal conductor 78 and a second metal conductor 80 are configured to be in contact with one another for conducting current up to a predetermined current threshold. When the current becomes excessive (e.g., potentially damaging to the probe card 30 and/or an IC device under test), the temperature of first metal conductor 78 and second metal conductor 80 rises, causing first metal conductor 78 (having a relatively higher rate of thermal expansion) to bend away from second metal conductor 80. As first metal conductor 78 and second metal conductor 80 bend away from each other, the contact between first metal conductor 78 and second metal conductor 80 eventually opens, thus interrupting current flow in conductive trace 34 (FIG. 5B). Eventually, the disruption of electrical current to conductive trace 34 resulting from the "open contact" causes the temperature of first metal conductor 78 and second metal conductor 80 to fall, thus allowing the contacts to reclose and permitting the current to flow again.

A series of embodiments of an active fuse on a probe card is shown in drawing FIGS. 6A, 6B, 6C and 6D. Therein, the active fuse comprises a Polymer Positive Temperature Coefficient (PPTC) fuse as an overcurrent protection mechanism interposed in, or located adjacent to, a conductive trace 34 on a probe card 30. Like components of each of FIGS. 6A, 6B, 6C and 6D are referenced by the same reference characters.

Figure 6A:
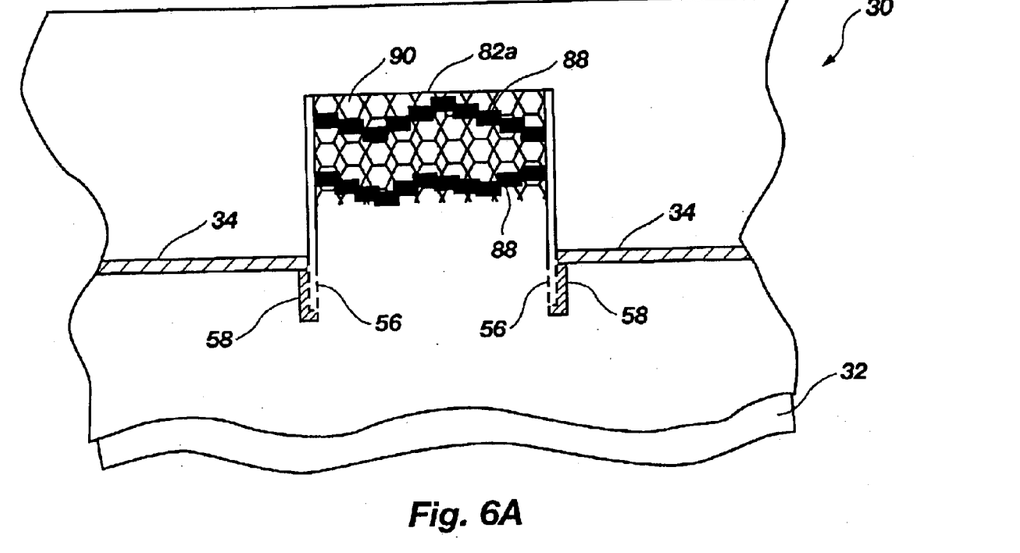
FIGS. 6A–6D are simplified diagrams of other active fuse embodiments of the present invention.
Figure 6B:
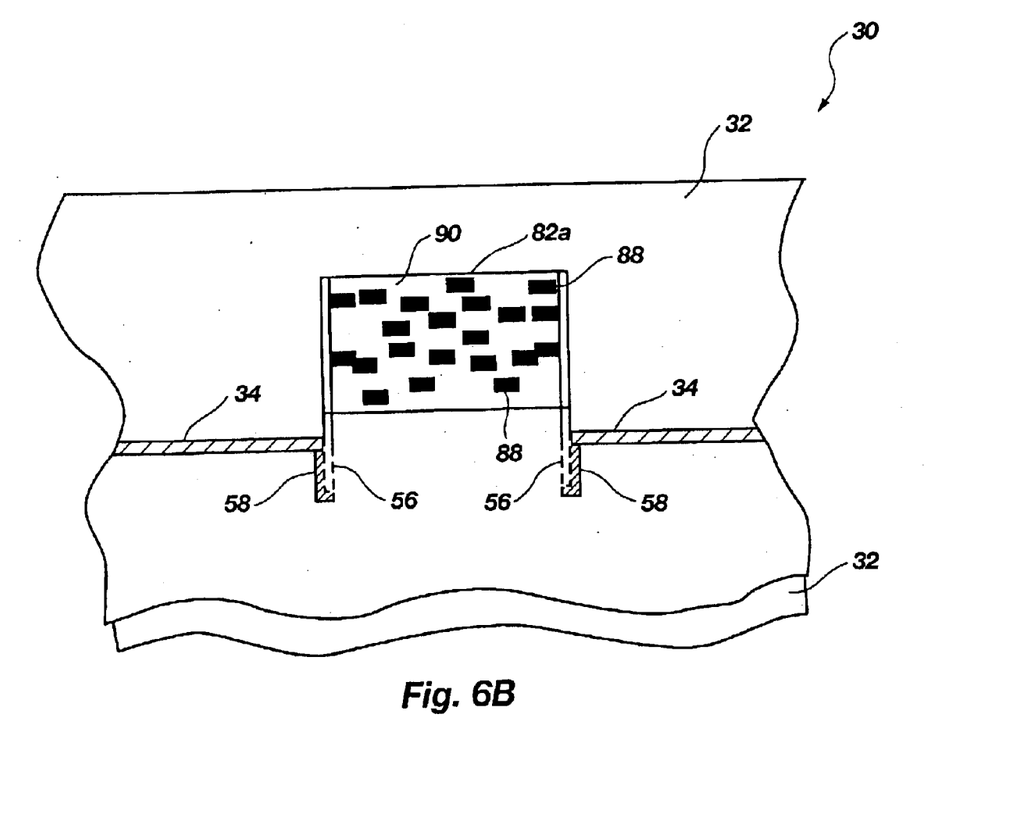
Figure 6C:
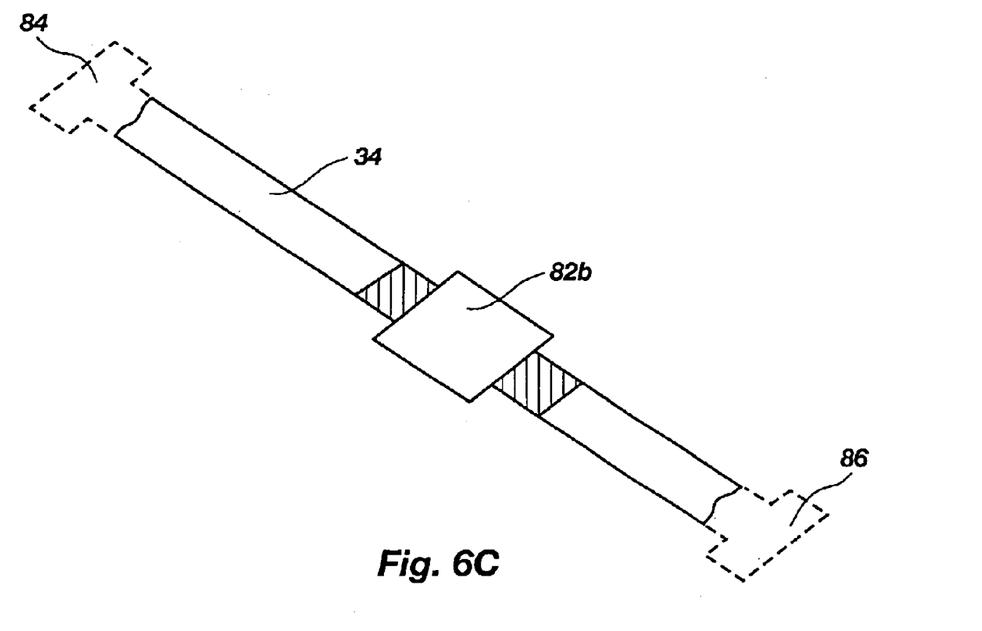
Figure 6D:
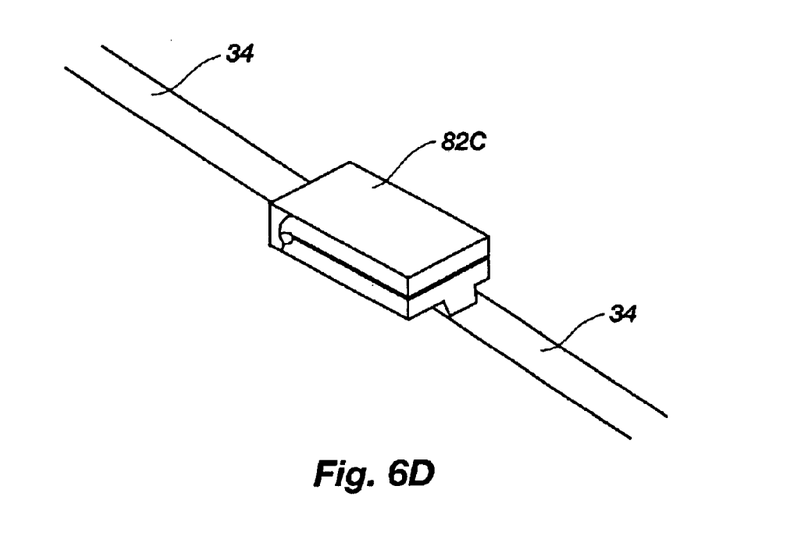

Various lead arrangements for PPTC fuses are shown in FIGS. 6A, 6C and 6D. In FIG. 6A, a PPTC active fuse 82a is shown having a radial lead arrangement positioned in a through-hole portion 56 of substrate 32 and in electrical communication with inner contacts 58. In FIG. 6B, the PPTC active fuse 82a of FIG. 6A is shown in tripped condition. A PPTC active fuse 82b having an axial lead arrangement with terminals 84, 86 in electrical communication with conductive trace 34 is shown in FIG. 6C. A PPTC active fuse 82c in a surface mount configuration known in the art is shown in FIG. 6D. Fuses 82b and 82c may be electrically connected to conductive traces 34 in a manner well known in the art, to include the use of conventional soldering techniques.

Generally, the PPTC active fuses 82a, 82b and 82c for use in the present invention are constructed with highly conductive carbon particles 88 combined with a nonconductive polymer 90 that exhibits two phases. In a first phase, which occurs under a predetermined current threshold, the polymer 90 exhibits a crystalline or semicrystalline structure in which the molecules form long chains and are arranged in a regular structure (FIG. 6A). In this phase, the carbon particles 88 are packed within the crystalline polymer structure, thus forming a conductive chain spanning between opposing electrodes of the PPTC fuse 82a.

When electricity is conducted through the crystalline structure, which has a low resistance configuration, the temperature increases within the PPTC fuse. At a predetermined temperature which is correlated with a current overload, this structure transitions by expanding to an amorphous phase which breaks the chain of conductive particles 88. The resulting random alignment of carbon particles 88 caused by the phase change instantly opens the circuit (FIG. 6B).

After the circuit has been opened for a certain period of time, the polymer 90 cools and returns to its normal crystalline state, thus allowing the carbon particles 88 to again touch and form conductive paths, upon which the circuit closes and the probe card can function properly. Thus, the PPTC fuses are advantageously self-resetting and do not have to be replaced as is the case with conventional passive fuses.

Preferably, the PPTC fuses for use in the present invention will have trip times of just a few milliseconds. Such PPTC fuses are presently available from several commercial sources, including Raychem Corporation (Menlo Park, Calif.) and Bourns Incorporated (Ogden, Utah).

It should be understood that while the above-described embodiments illustrate only a single fuse interposed in, or located adjacent to, a conductive trace on a probe card, the present invention contemplates a plurality of fuses interposed in, or located adjacent to, a plurality of respective conductive traces. The fuses may be passive fuses, active fuses, or combinations thereof. The use of an active fuse may be particularly desirable in the situation where a particular location of the fuse on the probe card renders the fuse not easily repairable or replaceable. Passive fuses may be particularly desirable in the situation where extremely short trip times are desirable and/or the location of the fuse renders it readily repairable or replaceable. For example, passive fuses may be preferable for placement in probe card conductive traces used for supplying relatively high voltages during IC testing (e.g., voltages supplied for burn-in testing of ICs).

In the preferred embodiments, at least one fuse according to the present invention is interposed in, or located adjacent to, each conductive trace. In some contemplated configurations, however, some, but not all, of the conductive traces may include a fuse configured according to the present invention. For example, a fuse may not be needed in one or more conductive traces on a probe card where the one or more conductive traces will be transporting extremely low voltage signals to an IC device under test.

Figure 7:
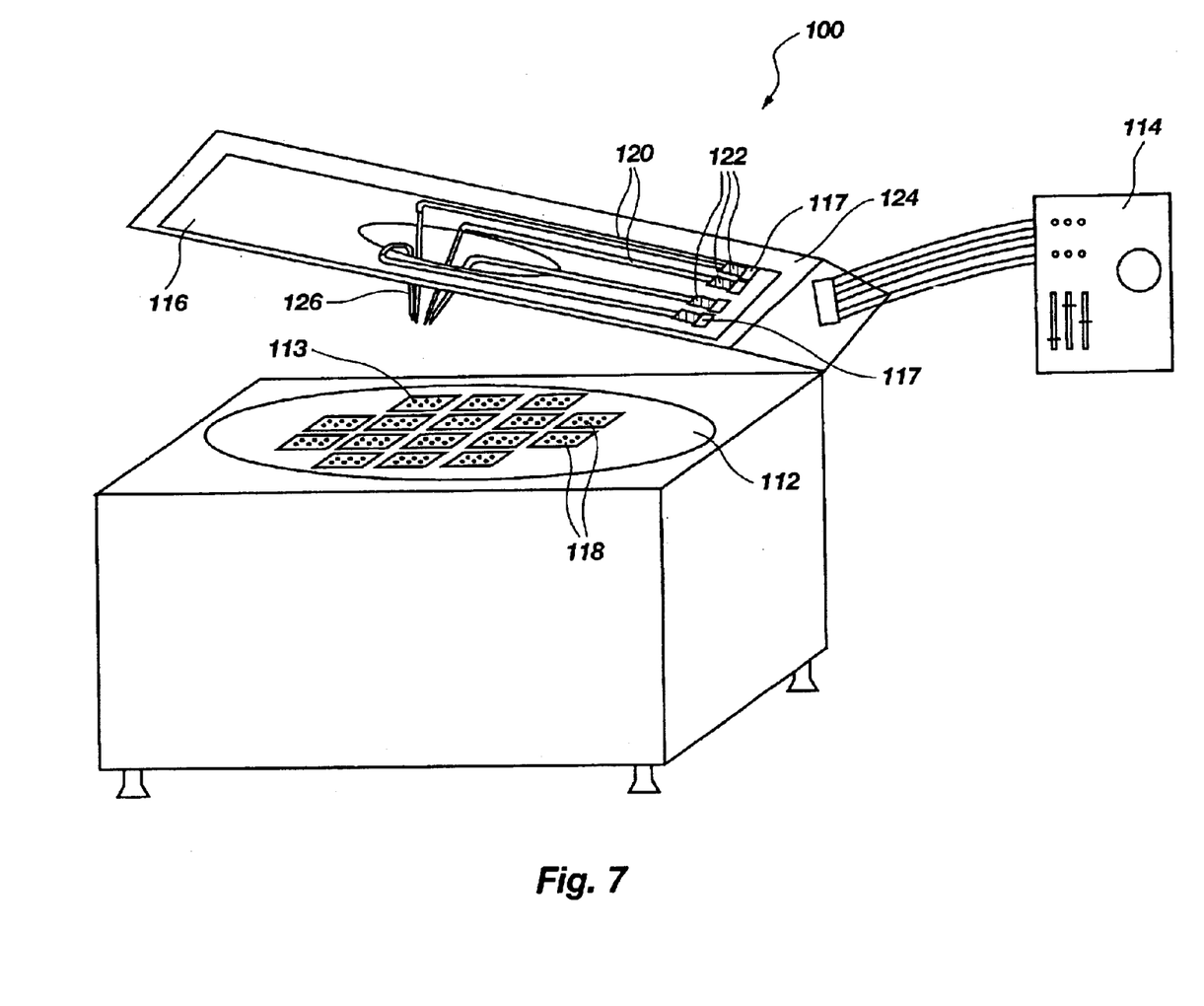
FIG. 7 is a simplified diagram of a test system in accordance with the present invention.

Referring to drawing FIG. 7, a simplified diagram of a test system 100 in accordance with the present invention is shown. The test system 100 typically includes a wafer handler (not shown) for handling and positioning a semiconductor wafer 112, test equipment 114 for generating test signals, and a probe card 116 for making temporary electrical connections with the semiconductor wafer 112. Semiconductor wafer 112 is configured with a plurality of bond pads 113 on an active surface thereof representing a plurality of unsingulated ICs 118. Probe card 116 is configured with a plurality of conductive traces 120 over at least one surface thereof. Interposed in, and/or located adjacent to, at least some, and preferably all, of the conductive traces 120 are fuses 122 provided in accordance with the above-described principles of the present invention.

A prober 124 (shown as transparent for purposes of clarity) typically lowers the probe card 116 on the semiconductor wafer 112 until probe elements 126 of probe card 116 come in contact with bond pads 113 on semiconductor wafer 112. Probe elements 126 are shown as needles, but may alternatively be configured as bumps, or other types of electrical contacts known in the art for making temporary electrical connections with bond pads 113 of semiconductor wafer 112. Test equipment 114 is in electrical communication with the test contacts 117 on probe card 116 and, upon activation, transmits test signals through the test contacts 117 and conductive traces 120 to probe elements 126. Alternately, the semiconductor wafer 112 may be raised into contact with the probe elements 126 of probe card 116 of a prober 124.

Preferably, but not necessarily, the semiconductor wafer 112 or the probe card 116 is stepped so that unsingulated dice on the semiconductor wafer 112 are tested in groups of two or more at a time in sequence. The test system 100 may also be configured to test all unsingulated dice on semiconductor wafer 112 at the same time. Upon probe elements 126 coming in contact with bond pads 113 of semiconductor wafer 112, test equipment 114 applies test signals and/or a power source voltage through probe card 116 to bond pads 113 and analyzes the resulting signals therefrom. During the testing process, fuses 122 protect probe card 116 and/or the ICs 118 on semiconductor wafer 112 from overcurrents and/or short circuits in the ICs 118.

Thus, upon an overload of current sufficient to damage the probe card 116, components thereof, or an IC device on semiconductor wafer 112, one or more fuses 122 exposed to the current overload will trip, thus disabling the circuit extending through probe card 116. If the one or more of the tripped fuses are configured as "active" fuses, the fuses will automatically reset after the fuse cools, thus rendering probe card 116 operational again. If the one or more tripped fuses are configured as "passive" fuses, the probe card 116 may be reused after the tripped fuses are repaired or replaced (depending upon the particular type of passive fuse used).

The described test system 100, however, is only exemplary, and the test apparatus may be configured for any of a variety of device tests on semiconductor wafer 112. Such testing may, for example, include basic parametric tests, low frequency functional testing, speed binning tests using specially designed test structures, boundary scan testing, and device testing at full operating frequency.

It will be appreciated by those skilled in the art that the embodiments herein described, while illustrating certain embodiments, are not intended to so limit the invention or the scope of the appended claims. As such, the various embodiments are merely exemplary of the present invention and, thus, the specific features described herein are merely used to more easily describe such embodiments and to provide an overall understanding of the present invention.

Those skilled in the art will also understand that various combinations or modifications of the preferred embodiments could be made without departing from the scope of the invention. For example, those skilled in the art will appreciate that a plurality of the fuses described herein may be interposed side by side in a conductive trace of a probe card.

Figure 8:
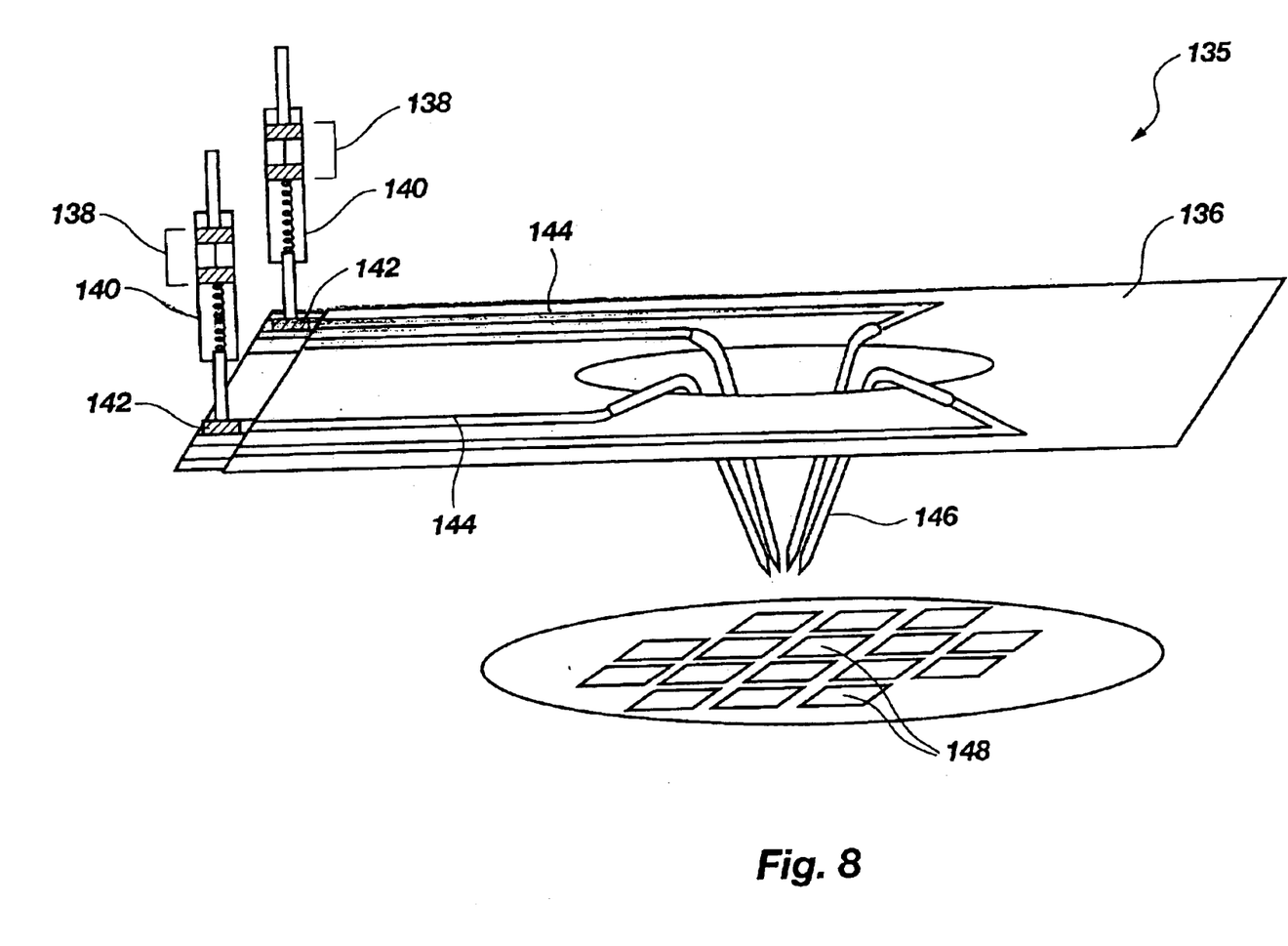
FIG. 8 illustrates a still further embodiment of the present invention.

In yet another embodiment which is illustrative of the scope of the present invention, a plurality of protective fuses 138 (provided in accordance with the principles of the present invention) can be configured as, interposed in, or placed adjacent to, pogo pin 140 portions of a probe card assembly 135 (drawing FIG. 8). As shown in drawing FIG. 8, pogo pins 140 form an interface between testing circuitry (not shown) and test contacts 142 on a probe card 136. Once apprized of the present invention, methods of providing protective fuses 138 as interposed in, or placed adjacent to, a pogo pin 140 will be apparent to one skilled in the art. For example, pogo pins 140 may be formed, in part, as a fuse body for holding one or more protective fuses 138.

In drawing FIG. 8, fuses 138 are illustrated as forming a portion of pogo pins 140. Pogo pins 140 enable a probe card 136 to be electrically connected with test equipment (not shown). Thus, pogo pins 140, including interposed fuses 138, are electrically connected to conductive traces 144 on probe card 136 via test contacts 142 residing on a probe card surface. Test signals are transmitted from the test equipment to probe card 136 by way of pogo pins 140 and fuses 138. Fuses 138 are configured to prevent excessive currents from being transmitted to probe card 136, thus preventing damage to probe card 136. Fuses 138 further prevent excessive currents from traveling through probe needles 146 to one or more IC devices under test 148. In a preferred aspect of the embodiment, fuses 138 which have been tripped due to excessive current may be replaced by, for example, inserting a new fuse 138 into a pogo pin 140 in the aspect of the embodiment where a pogo pin 140 is configured, in part, as a fuse body.

Furthermore, the probe cards for use in the present invention may comprise any type of probe card susceptible to the introduction of one or more fuses for the electrical protection of the probe card and/or components thereof. Thus, the methods and apparatus described herein are contemplated in a wide ranging variety of probe card configurations, including, but not limited to, vertical contact probe cards, cantilever-type probe cards, and probe cards for wafer level burn-in.

Additionally, the fuses described herein are suitable for use with a variety of other electrical components which may be found on a probe card. These components include resistors, transistors, capacitors, diodes, and the like.

Figure 9:
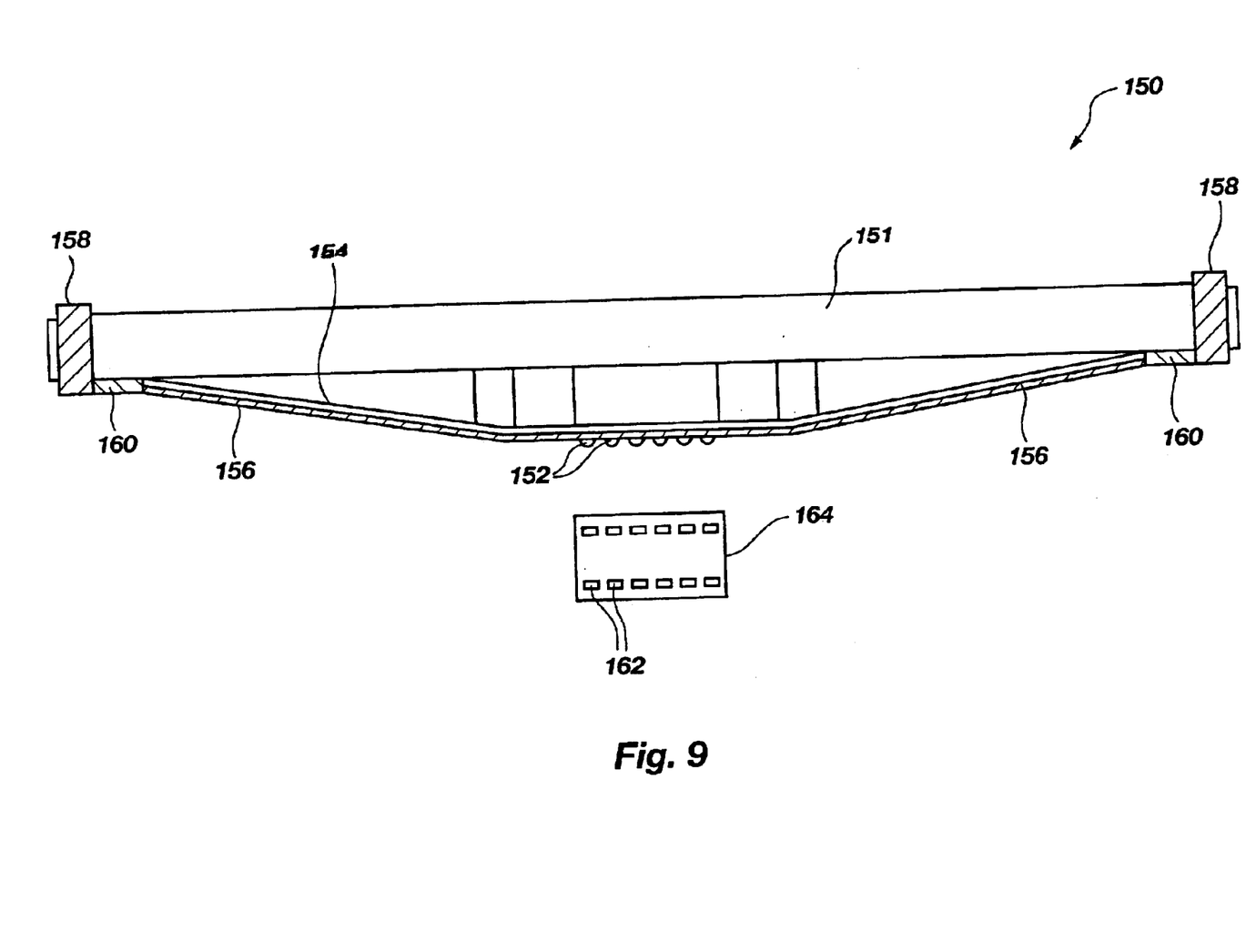
FIG. 9 shows a probe card embodiment of the present invention.

As a final example, this invention, while being primarily described with reference to a probe card configured with probe needles, has equal applicability to various other types of probe card configurations, including membrane-type probe cards. In this regard, a simplified schematic view of an exemplary membrane-type probe card 150 is shown in drawing FIG. 9. Membrane-type probe card 150 includes a carrier substrate 151 supporting a membrane 154 and a plurality of contact bumps 152 connected through the membrane 154 to conductive traces 156. Conductive traces 156 are in electrical communication with test contacts 158. Conductive traces 156 thus carry test signals from multi-channel testing equipment (not shown) to contact bumps 152. In turn, contact bumps 152 supply test signals from the testing equipment to contact pads 162 on an IC device under test 164. Interposed in, or adjacent to, conductive traces 156 are fuses 160 configured in accordance with the principles of the present invention.

Thus, while certain representative embodiments and details have been shown for purposes of illustrating the invention, it will be apparent to those skilled in the art that various changes to the invention disclosed herein may be made without departing from the scope of the invention, which is defined in the appended claims.

What is claimed is:

1. A method of using a probe card for testing at least one semiconductor die, comprising:

providing the probe card having a plurality of probe elements connected thereto, the plurality of probe elements configured for supplying test signals to the at least one semiconductor die;

providing a plurality of fuses in electrical communication with at least some of the plurality of probe elements, at least one of the plurality of fuses comprising a polymer positive temperature coefficient fuse, each polymer positive temperature coefficient fuse having a crystalline phase and a semi-crystalline phase; and testing the at least one semiconductor die by supplying test signals to the at least one semiconductor die through a fuse of the plurality of fuses.

2. The method of claim 1, further comprising repairing or replacing a fuse of the plurality of fuses if the fuse has been tripped by a test signal.

3. The method of claim 2, wherein the replacing the fuse comprises inserting a new fuse in through-hole portions of a surface of the probe card.

4. The method of claim 2, wherein the repairing the fuse comprises forming new portions of the fuse by a deposition technique.

5. A method of testing, comprising:

providing a probe card having a plurality of probe elements connected thereto, the plurality of probe elements configured for supplying test signals to at least one semiconductor die;

providing a plurality of fuses in electrical communication with at least some of the plurality of probe elements, at least one of the plurality of fuses comprising a polymer positive temperature coefficient fuse, each polymer positive temperature coefficient fuse having a crystalline phase and a semi-crystalline phase; and testing the at least one semiconductor die by supplying test signals to the at least one semiconductor die through a fuse of the plurality of fuses.

6. The method of claim 5, further comprising repairing or replacing a fuse of the plurality of fuses if the fuse has been tripped by a test signal.

7. The method of claim 6, wherein the replacing the fuse comprises inserting a new fuse in through-hole portions of a surface of the probe card.

8. The method of claim 6, wherein the repairing the fuse comprises forming new portions of the fuse by a deposition technique.

* * * * *